US010205048B1

(12) United States Patent
Tu et al.

(10) Patent No.: US 10,205,048 B1
(45) Date of Patent: Feb. 12, 2019

(54) METHOD FOR MANUFACTURING A LIGHT EMITTING DIODE CHIP

(71) Applicant: ADVANCED OPTOELECTRONIC TECHNOLOGY, INC., Hsinchu Hsien (TW)

(72) Inventors: Po-Min Tu, Hsinchu (TW); Tzu-Chien Hung, Hsinchu (TW); Chia-Hui Shen, Hsinchu (TW); Chien-Shiang Huang, Hsinchu (TW); Chien-Chung Peng, Hsinchu (TW)

(73) Assignee: ADVANCED OPTOELECTRONIC TECHNOLOGY, INC, Hsinchu Hsien (TW)

( * ) Notice: Subject to any disclaimer, the term of this patent is extended or adjusted under 35 U.S.C. 154(b) by 0 days.

(21) Appl. No.: 15/822,227

(22) Filed: Nov. 27, 2017

(30) Foreign Application Priority Data

Oct. 31, 2017 (CN) .......................... 2017 1 1047753

(51) Int. Cl.
*H01L 33/38* (2010.01)
*H01L 33/00* (2010.01)
*H01L 33/44* (2010.01)

(52) U.S. Cl.
CPC .......... *H01L 33/0079* (2013.01); *H01L 33/38* (2013.01); *H01L 33/44* (2013.01); *H01L 2933/0016* (2013.01); *H01L 2933/0025* (2013.01)

(58) Field of Classification Search
None
See application file for complete search history.

(56) References Cited

U.S. PATENT DOCUMENTS

| 2012/0074434 A1* | 3/2012 | Park | H01L 33/486 257/88 |
| 2018/0212105 A1* | 7/2018 | Tu | H01L 33/38 |

* cited by examiner

*Primary Examiner* — Bradley K Smith
(74) *Attorney, Agent, or Firm* — ScienBiziP, P.C.

(57) ABSTRACT

A method for manufacturing a light emitting diode (LED) chip comprises steps of stacking together a first substrate, a buffer layer, an ultraviolet light (UV) shielding layer, and at least one LED chip in that sequence. An orthogonal projection of each LED chip on the UV shielding layer is located in the scope of the UV shielding layer, and a periphery of the UV shielding layer protrudes from a periphery of the orthogonal projection; mounting a side of each LED chip facing away from the first substrate on the second substrate with an adhesive layer; irradiating UV light from a side of the first substrate facing away from the LED chip, to separate the first substrate from the UV shielding layer; removing the UV light shielding layer, the second substrate, and the adhesive layer from each LED chip.

15 Claims, 9 Drawing Sheets

METHOD FOR MANUFACTURING A LIGHT EMITTING DIODE CHIP

FIELD

The subject matter herein generally relates to a method for manufacturing a light emitting diode chip.

BACKGROUND

Light emitting diode (LED) is a semiconductor device for converting current to light. The light emitting diode has advantages of high brightness, low voltage, long life, and environmentally friendly. When light emitting diode chips are separated from a substrate, an adhesive layer bonding the light emitting diode chips and the substrate is hard to remove completely.

BRIEF DESCRIPTION OF THE DRAWINGS

Implementations of the present technology will now be described, by way of example only, with reference to the attached figures.

DETAILED DESCRIPTION

Figure 1:
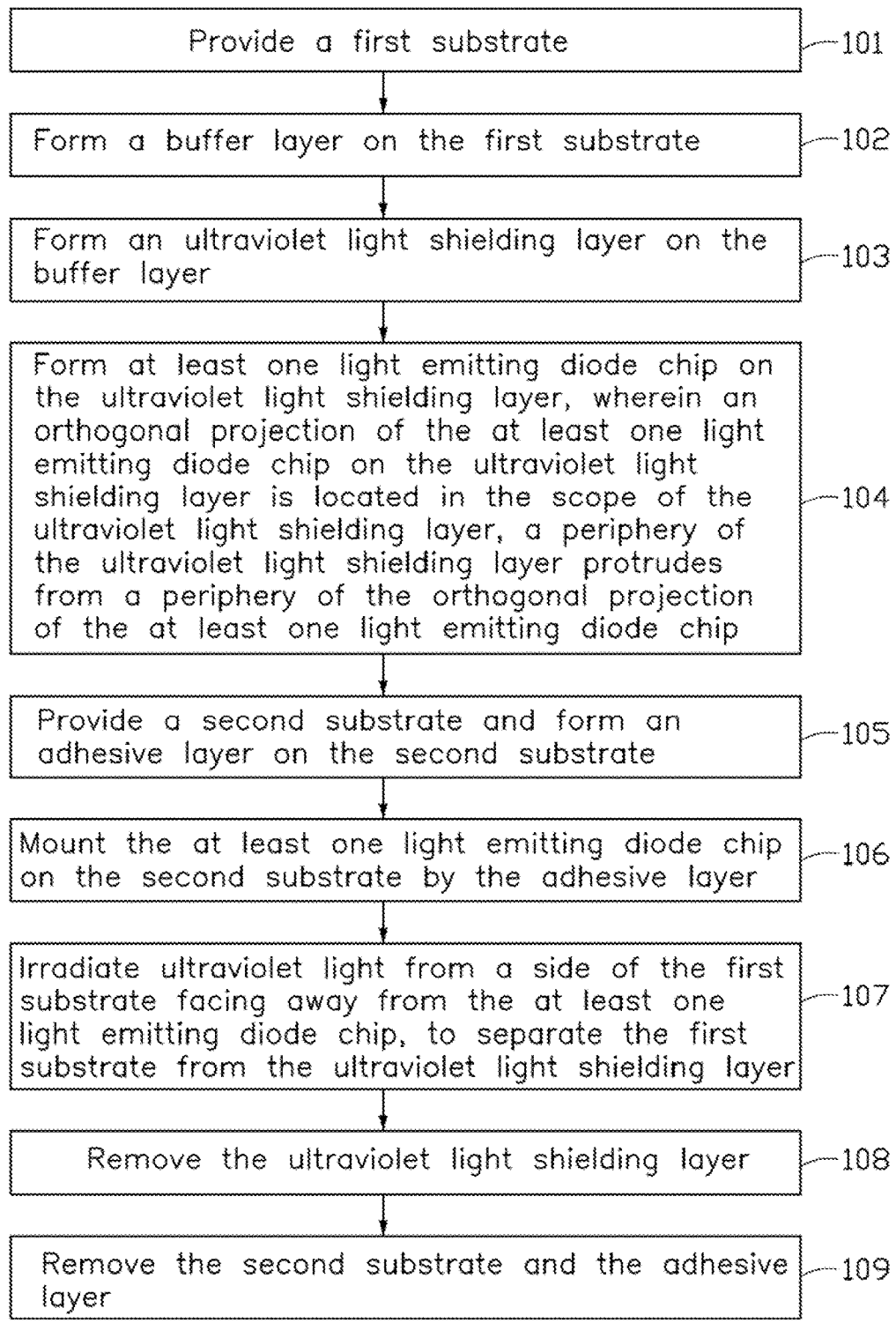
FIG. 1 is a flowchart of an exemplary embodiment of a method for manufacturing an LED chip.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

FIG. 1 illustrates a flowchart of a method in accordance with an exemplary embodiment. The exemplary method for manufacturing a light emitting diode chip 100 (shown in FIG. 9) is provided by way of example only, as there are a variety of ways to carry out the method. Each block shown in FIG. 1 represents one or more processes, methods, or subroutines carried out in the exemplary method. Furthermore, the illustrated order of blocks is by example only and the order of the blocks can be changed. Additional blocks may be added or fewer blocks may be utilized, without departing from this disclosure. The exemplary method can begin at block 101.

Figure 2:
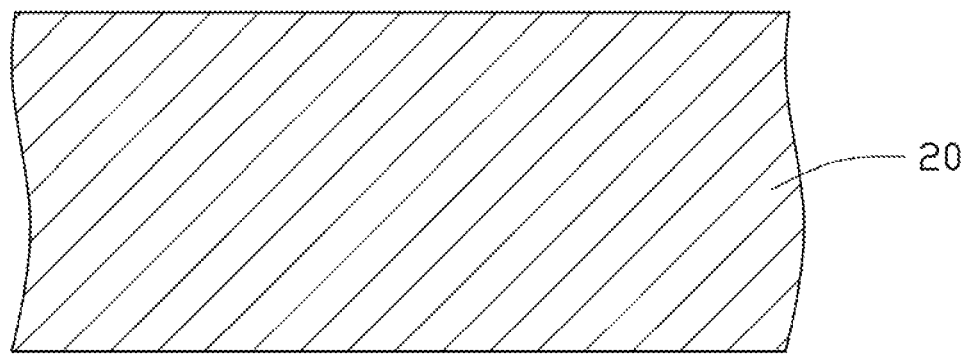
FIG. 2 is a cross-sectional view of a first substrate of the LED chip of FIG. 1.

At block 101, referring to FIG. 2, a first substrate 20 is provided.

In at least one exemplary embodiment, the first substrate 20 is made of sapphire.

Figure 3:
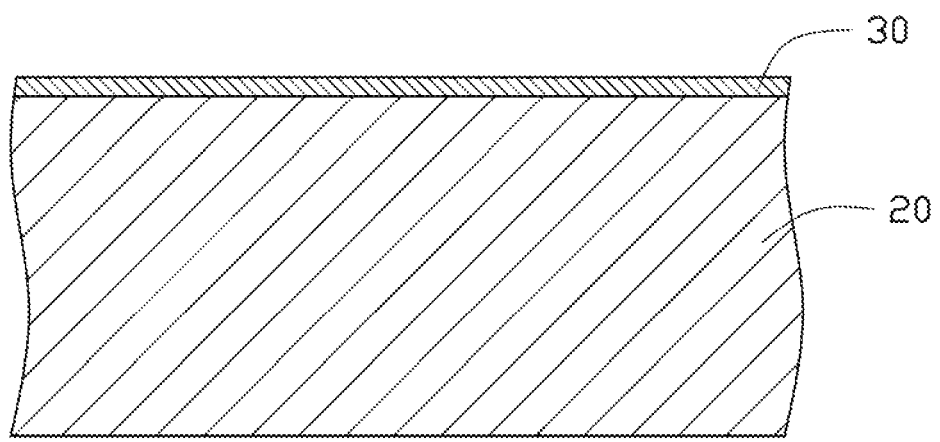
FIG. 3 is a cross-sectional view showing a buffer layer formed on the first substrate of FIG. 2.

At block 102, referring to FIG. 3, a buffer layer 30 is formed on a surface of the first substrate 20. The buffer layer 30 breaks down under ultraviolet light.

In at least one exemplary embodiment, the buffer layer 30 is an undoped gallium nitride layer or an undoped aluminum nitride layer.

Figure 4:
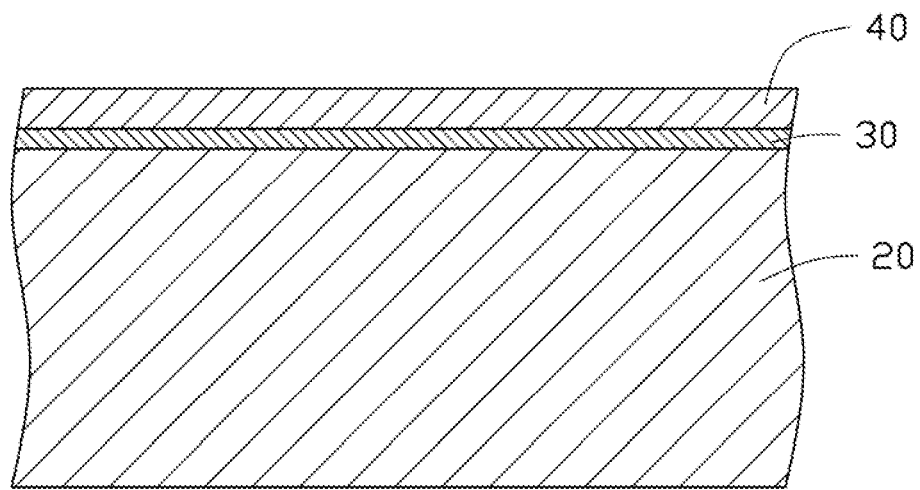
FIG. 4 is a cross-sectional view showing an ultraviolet light shielding layer formed on the buffer layer of FIG. 3.

At block 103, referring to FIG. 4, an ultraviolet light shielding layer 40 is formed on a surface of the buffer layer 30 facing away from the first substrate 20.

In at least one exemplary embodiment, the ultraviolet light shielding layer 40 may be an InGaAlN layer, a GaN layer, an InGaN layer, or an AlGaN layer. A thickness of the ultraviolet light shielding layer 40 is greater than 0.2 mm. In at least one exemplary embodiment, the ultraviolet light shielding layer 40 has the thickness of about 0.5 mm to about 3 mm.

Figure 5:
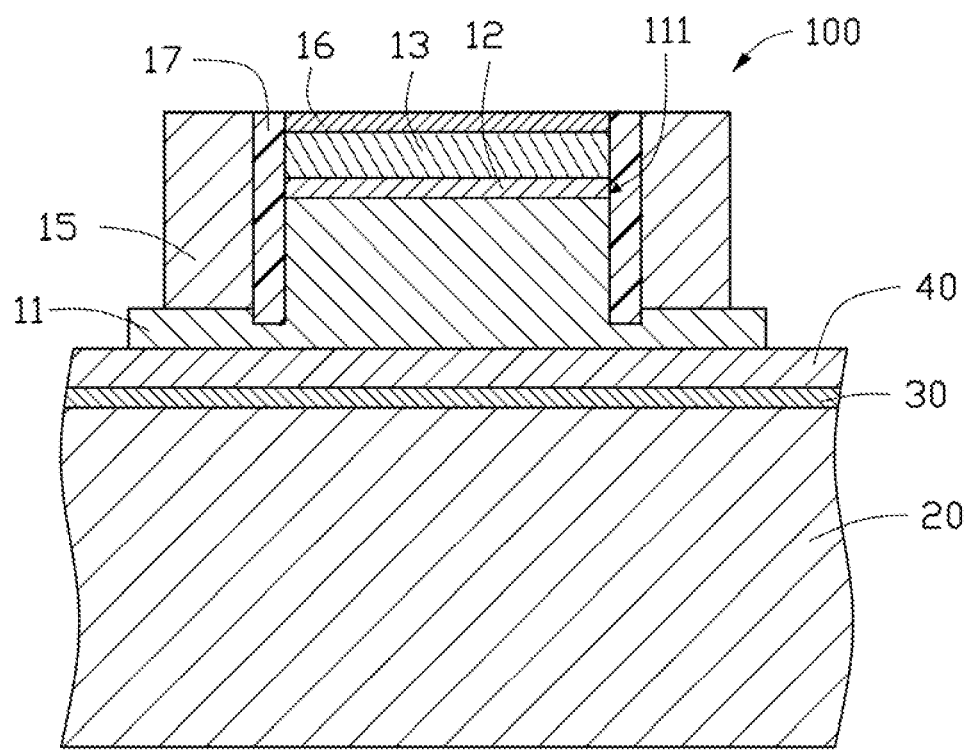
FIG. 5 is a cross-sectional view showing at least one light emitting diode chip formed on the ultraviolet light shielding layer of FIG. 4.

At block 104, referring to FIG. 5, at least one light emitting diode chip 100 is formed on a surface of the ultraviolet light shielding layer 40 facing away from the buffer layer 30. An orthogonal projection of the at least one light emitting diode chip 100 on the ultraviolet light shielding layer 40 is located in the scope of the ultraviolet light shielding layer 40. A periphery of the ultraviolet light shielding layer 40 protrudes from a periphery of the orthogonal projection of the at least one light emitting diode chip 100.

In at least one exemplary embodiment, each light emitting diode chip 100 has a thickness of about 1 μm to about 10 μm. In the illustrated exemplary embodiment, each light emitting diode chip 100 has a thickness of about 4.35 μm.

Figure 6:
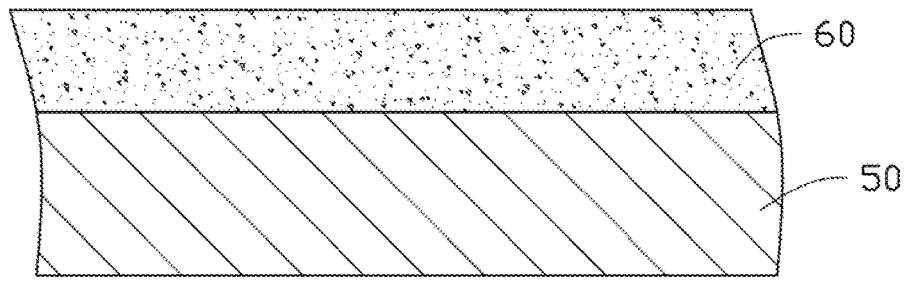
FIG. 6 is a cross-sectional view showing an adhesive layer formed on a second substrate of the LED chip of FIG. 1.

At block 105, referring to FIG. 6, a second substrate 50 is provided, and an adhesive layer 60 is formed on a surface of the second substrate 50.

The second substrate 50 can be made of glass, aluminium oxide, or ceramics. The adhesive layer 60 can be broken down by heating, cooling, chemolysis, or ultraviolet light. The adhesive layer 60 may be epoxy resin, silicone adhesive, or wax.

Figure 7:
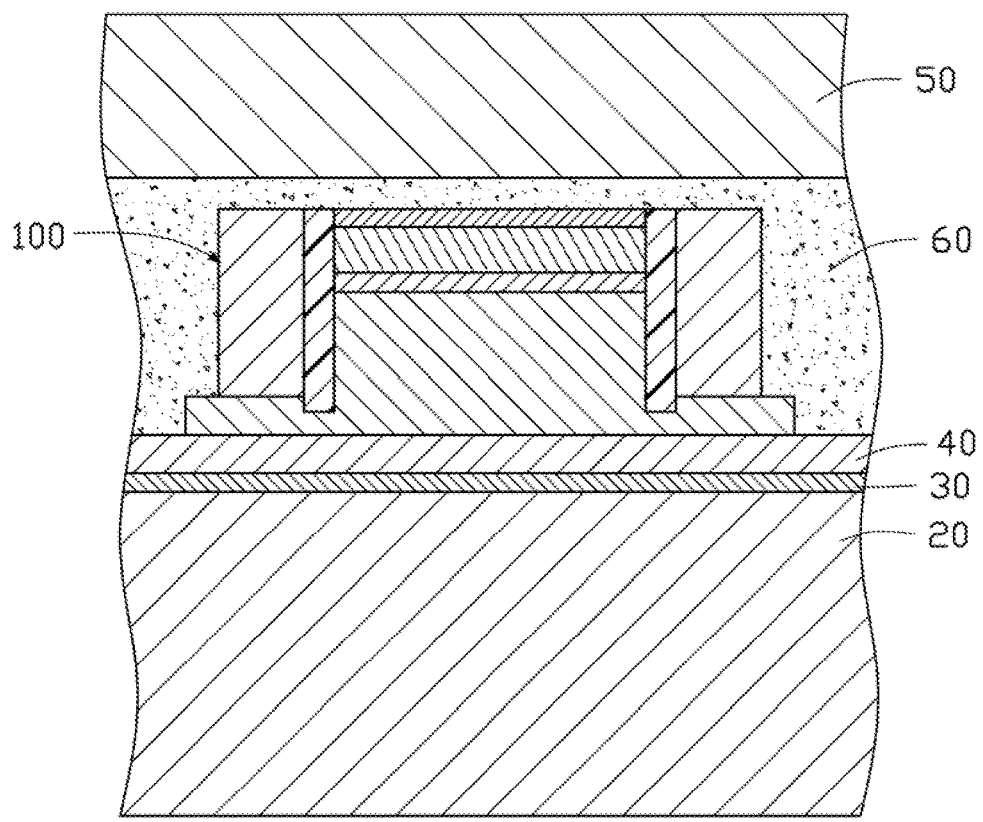
FIG. 7 is a cross-sectional view showing the light emitting diode chip reversely mounted on the second substrate by the adhesive layer of FIG. 6.

At block 106, referring to FIG. 7, the at least one light emitting diode chip 100 is reversely mounted on the second substrate 50 by the adhesive layer 60.

In at least one exemplary embodiment, the adhesive layer 60 fully infills any gap between the first substrate 20 and the second substrate 50.

Figure 8:
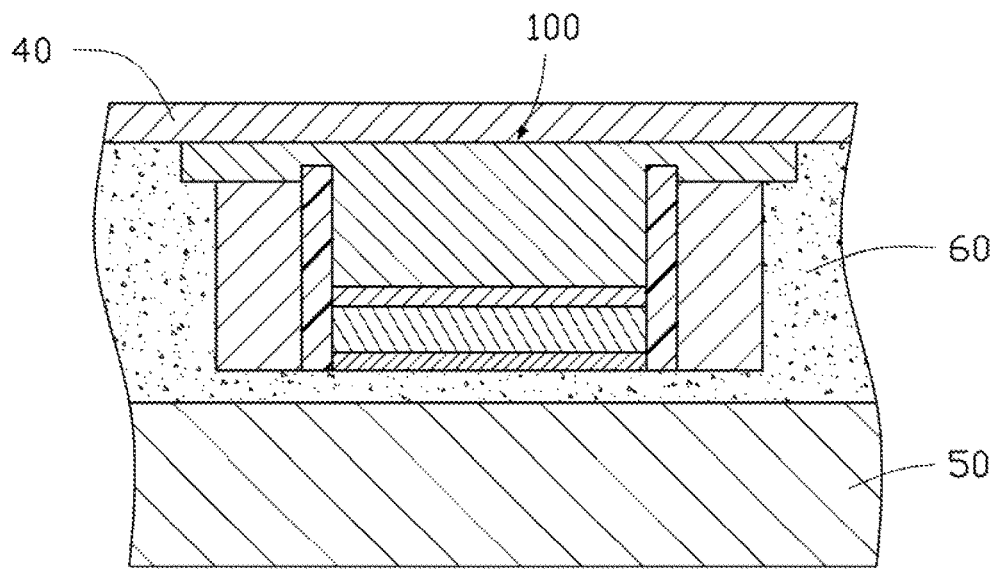
FIG. 8 is a cross-sectional view showing the first substrate and the buffer layer of FIG. 7 removed.

At block 107, referring to FIG. 8, the first substrate 20 is irradiated by ultraviolet light from a side of the first substrate 20 facing away from the light emitting diode chip 100. The buffer layer 30 breaks downto cause the first substrate 20 to be separated from the ultraviolet light shielding layer 40.

Figure 9:
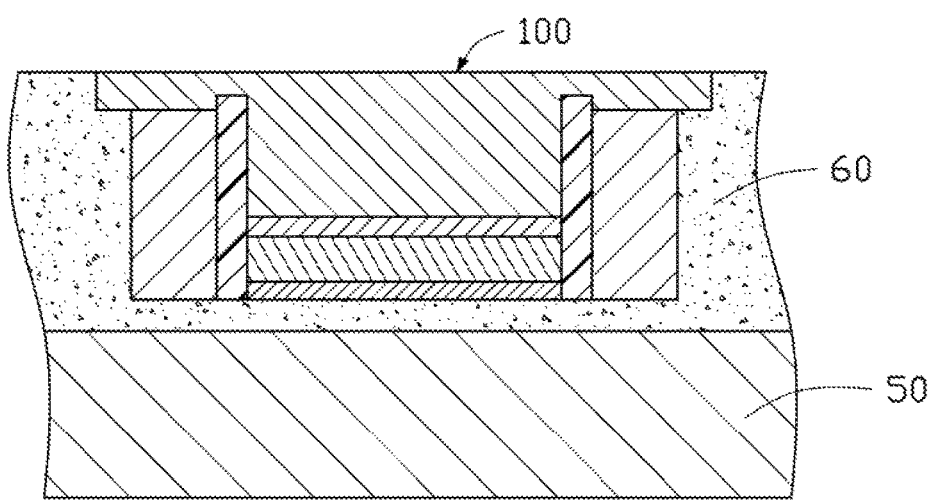
FIG. 9 is a cross-sectional view showing the ultraviolet light shielding layer of FIG. 8 removed.

At block 108, referring to FIG. 9, the ultraviolet light shielding layer 40 is removed from the at least one light emitting diode chip 100 by etching.

Figure 10:
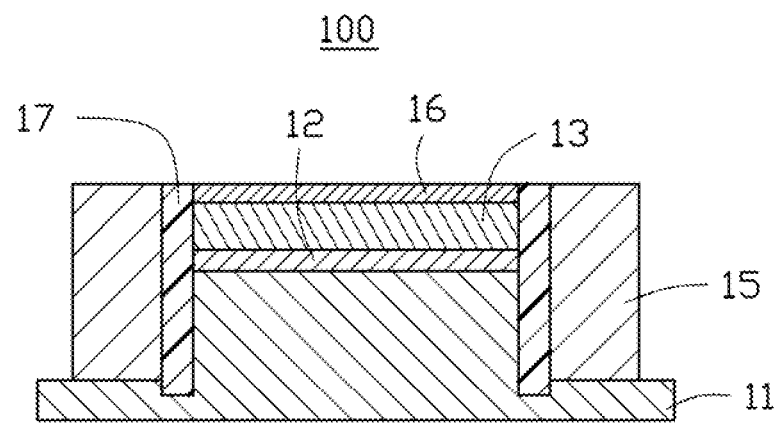
FIG. 10 is a cross-sectional view showing the second substrate and the adhesive layer of FIG. 9 removed.

At block 109, referring to FIG. 10, the second substrate 50 and the adhesive layer 60 are removed. Thereby, the at least one light emitting diode chip 100 is obtained.

In at least one exemplary embodiment, the adhesive layer 60 is removed from the second substrate 50 and the at least one light emitting diode chip 100 by using acetone, then obtaining the at least one light emitting diode chip 100. The orthogonal projection of the at least one light emitting diode chip 100 on the ultraviolet light shielding layer 40 is located in the scope of the ultraviolet light shielding layer 40; further, the periphery of the ultraviolet light shielding layer 40 protrudes from the periphery of the orthogonal projection of the at least one light emitting diode chip 100. These arrangements ensure that the at least one light emitting diode chip 100 and the adhesive layer 60 contacting the at least one light emitting diode chip 100 are not irradiated by the ultraviolet light when the first substrate 20 is separated from the ultraviolet light shielding layer 40. Burning or carbonization of the adhesive layer 60 which is in contact with the at least one light emitting diode chip 100 is thus prevented. The adhesive layer 60 can thus be removed easily from the at least one light emitting diode chip 100.

In another exemplary embodiment, the adhesive layer 60 may be removed by using alkane organic solvent, benzene organic solvent (such as methylbenzene and dimethylbenzene), alcohol organic solvent (isopropyl alcohol), and other ketone organic solvent.

In at least one exemplary embodiment, after the block 107 and before the block 108, the method further comprises a step of removing any residue of the buffer layer 30 by hydrochloric acid. The buffer layer 30 residue may remain after separating the first substrate 20 from the ultraviolet light shielding layer 40.

Figure 11:
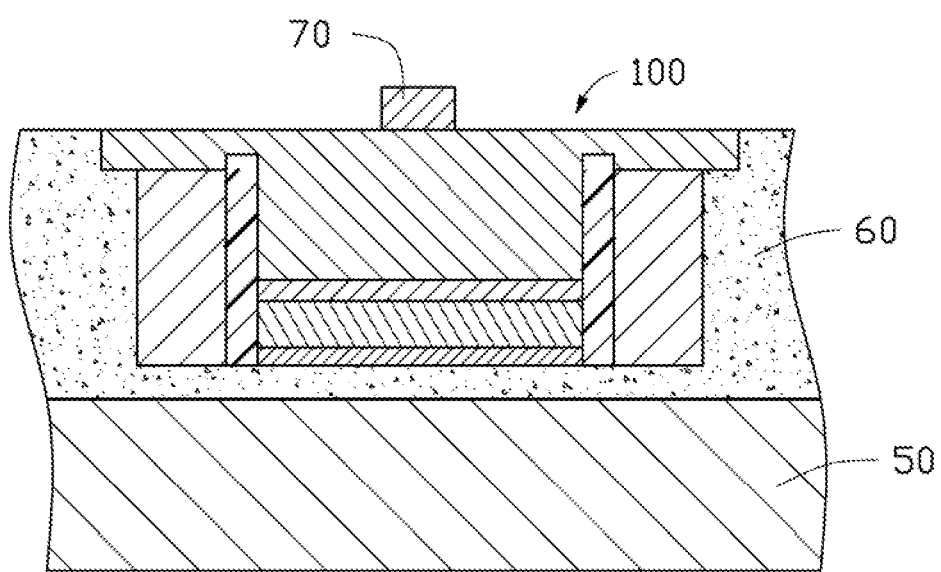
FIG. 11 is a cross-sectional view showing a positioning portion formed on the light emitting diode chip of FIG. 8.

In at least one exemplary embodiment, after the block 108 and before the block 109, referring to FIG. 11, a positioning portion 70 may be formed on a surface of each light emitting diode chip 100 facing away from the second substrate 50. The positioning portion 70 is made of a material selected from a group consisting of rubber material, polymer material, silicon, $SiN_x$, quantum dots, and any combination thereof. The positioning portion 70 is black, white, or transparent. The positioning portion 70 has a height of about 0.2 μm to about 40 μm, and has a width of about 0.5 μm to about 40 μm. In least one exemplary embodiment, the positioning portion 70 has a height of about 2 μm, and has a width of about 5 μm.

Figure 12:
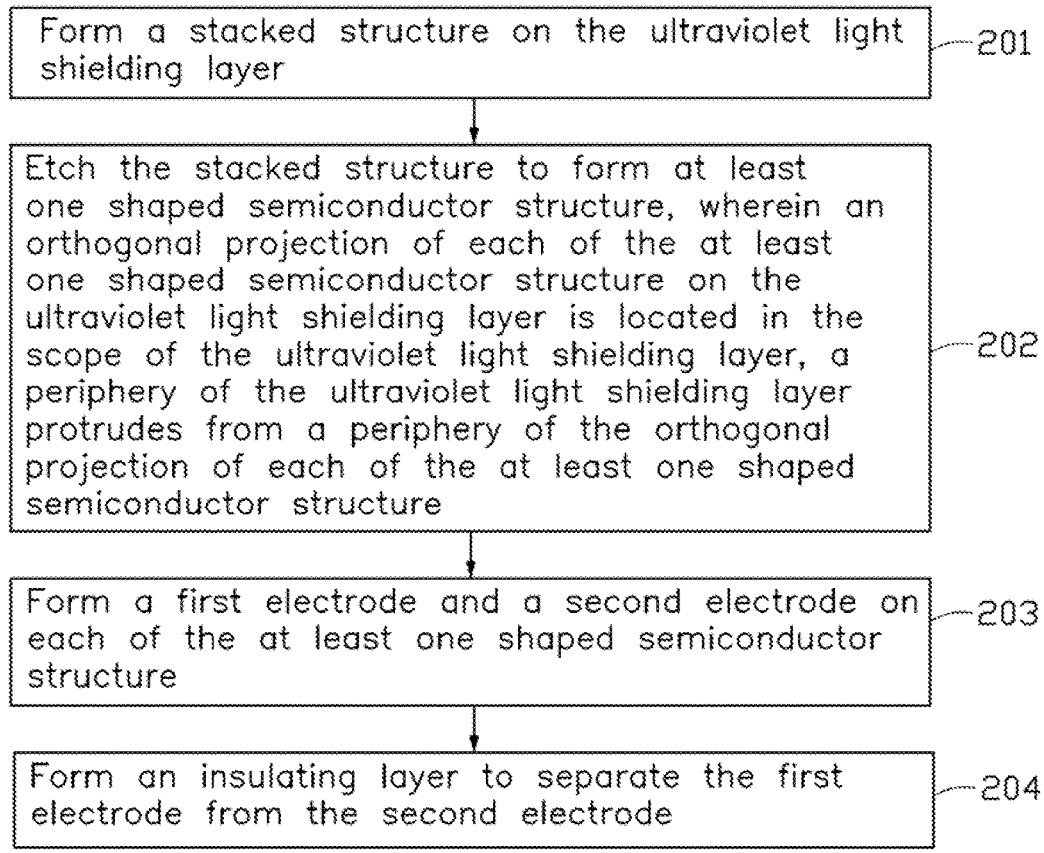
FIG. 12 is a flowchart of an exemplary embodiment of a method for forming one light emitting diode chip on the ultraviolet light shielding layer.

FIG. 12 illustrates a flowchart of a method for forming the at least one light emitting diode chip 100 on the surface of the ultraviolet light shielding layer 40. The exemplary method can begin at block 201.

Figure 13:
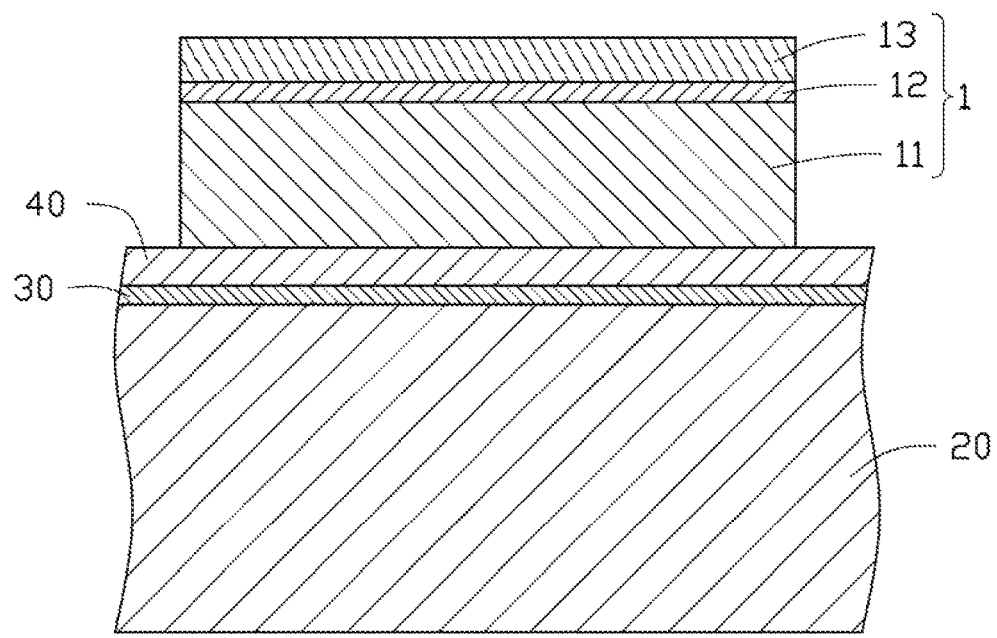
FIG. 13 is a cross-sectional view showing a stacked structure formed on the ultraviolet light shielding layer of FIG. 4.

At block 201, referring to FIG. 13, a stacked structure 1 is formed on a surface of the ultraviolet light shielding layer 40 facing away from the buffer layer 30.

The stacked structure 1 comprises a first semiconductor layer 1, a light active layer 12, and a second semiconductor layer 13 arranged in that sequence. The first semiconductor layer 11 is combined with the surface of the ultraviolet light shielding layer 40.

Figure 14:
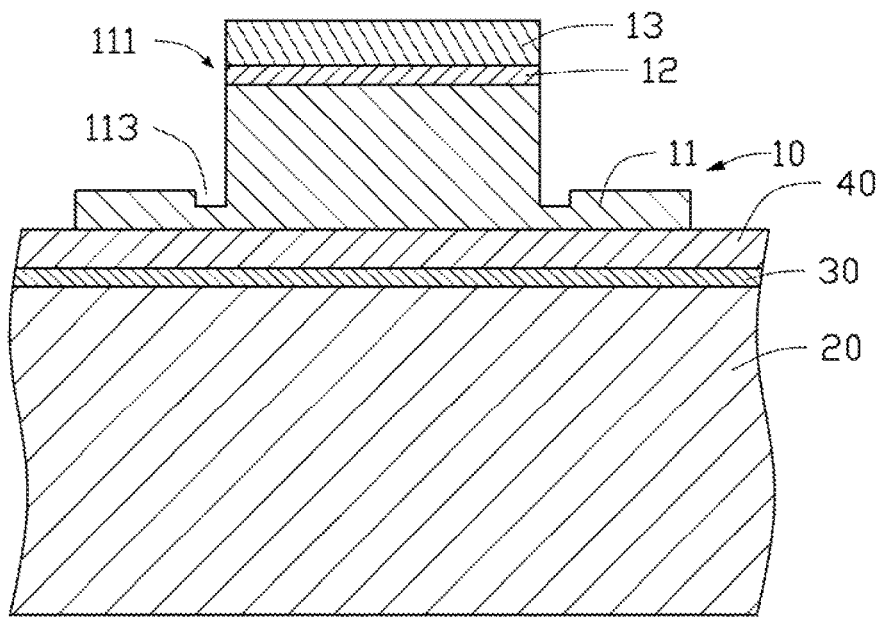
FIG. 14 is a cross-sectional view showing the stacked structure of FIG. 13 etched to form at least one shaped semiconductor structure.

At block 202, referring to FIG. 14, the stacked structure 1 is etched to form at least one shaped semiconductor structure 10. A peripheral region of the etched first semiconductor layer 11 is exposed. An orthogonal projection of each shaped semiconductor structure 10 on the ultraviolet light shielding layer 40 is located in the scope of the ultraviolet light shielding layer 40. A periphery of the ultraviolet light shielding layer 40 protrudes from a periphery of the orthogonal projection of each shaped semiconductor structure 10.

In at least one exemplary embodiment, each shaped semiconductor structure 10 is T-shaped. Each shaped semiconductor structure 10 comprises the exposed peripheral region of the etched first semiconductor layer 11 and a laminate structure 110. The laminate structure 110 comprises the etched second semiconductor layer 13, the etched light active layer 12, and a region of the etched first semiconductor layer 11 covered by the etched light active layer 12.

In at least one exemplary embodiment, a groove 113 is defined between the exposed peripheral region of the etched first semiconductor layer 11 and the region of the etched first semiconductor layer 11 covered by the etched light active layer 12.

Figure 15:
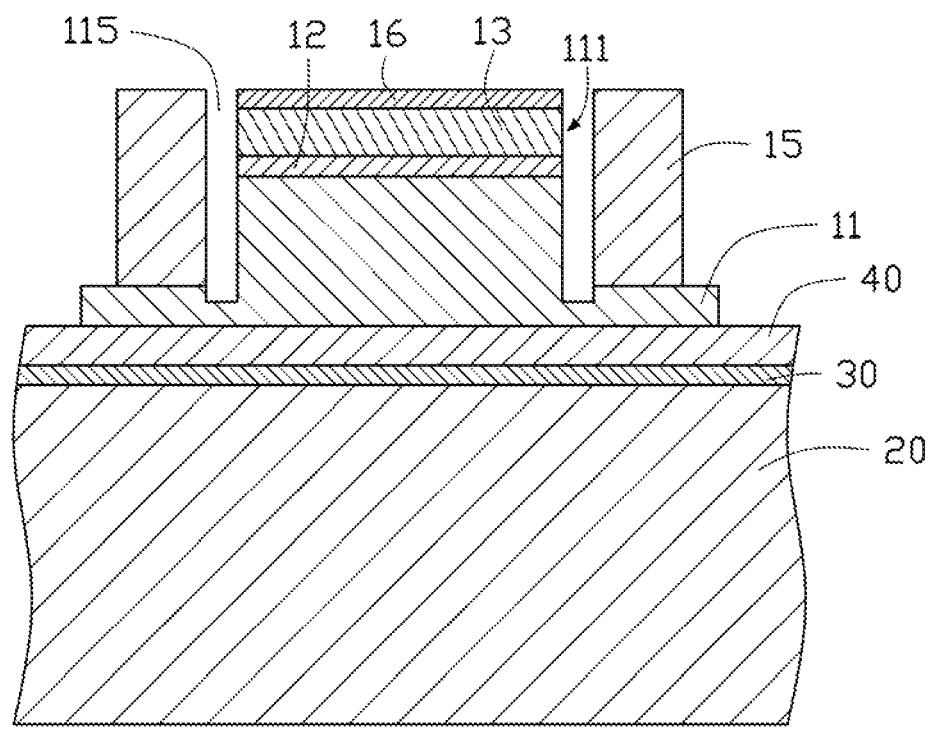
FIG. 15 is a cross-sectional view showing a first electrode and a second electrode formed on each shaped semiconductor structure of FIG. 14.

At block 203, referring to FIG. 15, a first electrode 15 is formed on the exposed peripheral region of the etched first semiconductor layer 11, and a second electrode 16 is formed on a surface of the etched second semiconductor layer 13 facing away from the etched light active layer 12. A space 115 is defined to separate the first electrode 15 from the laminate structure 110 and the second electrode 16.

In at least one exemplary embodiment, a surface of the first electrode 15 facing away from the etched first semiconductor layer 11 is flush with a surface of the second electrode 16 facing away from the etched second semiconductor layer 13. The first electrode 15 is circular, and the second electrode 16 is annular. The first electrode 15 is concentric with the second electrode 16.

At block 204, referring to FIG. 5, an insulating layer 17 is formed in the space 115, thereby forming at least one light emitting diode chip 100. An orthogonal projection of the at least one light emitting diode chip 100 on the ultraviolet light shielding layer 40 is located in the scope of the ultraviolet light shielding layer 40. A periphery of the ultraviolet light shielding layer 40 protrudes from a periphery of the orthogonal projection of the at least one light emitting diode chip 100.

In at least one exemplary embodiment, one end portion of the insulating layer 17 is located in the groove 113, the other end portion which faces away from the etched first semiconductor layer 11 is flush with the first electrode 15.

In another exemplary embodiment, the block 204 can be omitted.

In another exemplary embodiment, a structure of the light emitting diode chip 100 can vary according to specific needs.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for manufacturing a light emitting diode chip comprising:
   providing a first substrate;
   forming a buffer layer on a surface of the first substrate;
   forming an ultraviolet light shielding layer on a surface of the buffer layer facing away from the first substrate;
   forming at least one light emitting diode chip on a surface of the ultraviolet light shielding layer facing away from the buffer layer, wherein an orthogonal projection of the at least one light emitting diode chip on the ultraviolet light shielding layer is located in the scope of the ultraviolet light shielding layer, a periphery of the ultraviolet light shielding layer protrudes from a periphery of the orthogonal projection of the at least one light emitting diode chip;
   providing a second substrate and forming an adhesive layer on a surface of the second substrate;
   mounting the at least one light emitting diode chip on the second substrate by the adhesive layer, the at least one light emitting diode chip sandwiched between the first substrate and the second substrate;
   irradiating ultraviolet light from a side of the first substrate facing away from the at least one light emitting diode chip, to separate the first substrate from the ultraviolet light shielding layer;
   removing the ultraviolet light shielding layer from the at least one light emitting diode chip; and
   removing the second substrate and the adhesive layer, thereby obtaining the at least one light emitting diode chip.

2. The method of the claim 1, wherein the ultraviolet light shielding layer is InGaAlN layer, a GaN layer, an InGaN layer, or an AlGaN layer.

3. The method of the claim 1, wherein a thickness of the ultraviolet light shielding layer is greater than 0.2 mm.

4. The method of the claim 3, wherein the ultraviolet light shielding layer has the thickness of about 0.5 mm to about 3 mm.

5. The method of the claim 1, wherein the ultraviolet light shielding layer is removed by etching.

6. The method of the claim 1, wherein after separating the first substrate from the at least one light emitting diode chip, and before removing the ultraviolet light shielding layer, the method further comprises:
   removing the buffer layer by hydrochloric acid, which remains after separating the first substrate from the ultraviolet light shielding layer.

7. The method of the claim 1, wherein after removing the ultraviolet light shielding layer, and before removing the second substrate and the adhesive layer, the method further comprises:
   forming a positioning portion on a surface of each of the at least one light emitting diode chip facing away from the second substrate.

8. The method of the claim 7, wherein the positioning portion is made of a material selected from a group consisting of rubber material, polymer material, silicon, $SiN_x$, quantum dots, and any combination thereof.

9. The method of the claim 1, wherein forming the at least one light emitting diode chip on the surface of the ultraviolet light shielding layer further comprises:
   forming a stacked structure on a surface of the ultraviolet light shielding layer facing away from the buffer layer, the stacked structure comprising a first semiconductor layer, a light active layer, and a second semiconductor layer arranged in that sequence, the first semiconductor layer combined with the surface of the ultraviolet light shielding layer;
   etching the stacked structure to form at least one shaped semiconductor structure, wherein a peripheral region of the etched first semiconductor layer is exposed, the etched second semiconductor layer, the etched light active layer, and a region of the etched first semiconductor layer covered by the etched light active layer of each of the at least one shaped semiconductor structure are together formed a laminate structure, an orthogonal projection of each of the at least one shaped semiconductor structure on the ultraviolet light shielding layer is located in the scope of the ultraviolet light shielding layer, a periphery of the ultraviolet light shielding layer protrudes from a periphery of the orthogonal projection of each of the at least one shaped semiconductor structure; and
   forming a first electrode on the exposed peripheral region of the etched first semiconductor layer, and forming a second electrode on a surface of the etched second semiconductor layer facing away from the etched light active layer, wherein a space is defined to separate the first electrode from the laminate structure and the second electrode.

10. The method of the claim 9, wherein a surface of the first electrode facing away from the etched first semiconductor layer is flush with a surface of the second electrode facing away from the etched second semiconductor layer.

11. The method of the claim 9, wherein the first electrode is circular, and the second electrode is annular.

12. The method of the claim 11, wherein the first electrode is concentric with the second electrode.

13. The method of the claim 9, wherein after forming the first electrode and the second electrode, the method further comprises:
   forming an insulating layer in the space.

14. The method of the claim 9, wherein during etching the stacked structure, the method further comprises:
   defining a groove between the exposed peripheral region of the etched first semiconductor layer and the region of the etched first semiconductor layer covered by the etched light active layer.

15. The method of the claim 14, wherein after forming the first electrode and the second electrode, the method further comprises:
   forming an insulating layer in the space, wherein an end portion of the insulating layer is located in the groove.

* * * * *